United States Patent [19]

Abe et al.

[11] 4,240,439
[45] Dec. 23, 1980

[54] METHOD OF OBTAINING INFORMATION OF A SPECIFIED OR TARGET AREA OF A LIVING BODY NEAR ITS SKIN SURFACE BY THE APPLICATION OF A NUCLEAR MAGNETIC RESONANCE PHENOMENON

[75] Inventors: Zenuemon Abe, Sapporo; Kunio Tanaka, Asahikawa; Fumio Sano, Sapporo, all of Japan

[73] Assignee: Hokkaido University

[21] Appl. No.: 901,078

[22] Filed: Apr. 28, 1978

Related U.S. Application Data

[63] Continuation of Ser. No. 653,734, Jan. 30, 1976, abandoned.

[30] Foreign Application Priority Data

Apr. 30, 1975 [JP] Japan .................................. 50-52408

[51] Int. Cl.³ ............................................. A61B 5/05
[52] U.S. Cl. .................................................. 128/653
[58] Field of Search ............... 128/2 R, 2 A, 1.3, 1.5, 128/653; 324/0.5 R, 0.5 A, 307, 309

[56] References Cited

U.S. PATENT DOCUMENTS

| | | | |
|---|---|---|---|
| 3,419,793 | 12/1968 | Genthe et al. | 324/0.5 R |
| 3,638,104 | 1/1972 | Wright | 324/0.5 A |
| 3,691,455 | 9/1972 | Moisio et al. | 324/0.5 R |
| 3,789,832 | 2/1974 | Damadian | 128/2 R |
| 3,932,805 | 1/1976 | Abe et al. | 324/0.5 A |

*Primary Examiner*—Kyle L. Howell
*Attorney, Agent, or Firm*—Staas & Halsey

[57] ABSTRACT

This invention relates to a method of obtaining information of a specified or target area of a living body near its skin surface by the application of a nuclear magnetic resonance phenomenon (NMR). This invention comprises a static magnetic field generator for generating a static magnetic field $H_0$, a radio-frequency magnetic field generator for generating a radio-frequency magnetic field $H_1$ perpendicular to said static magnetic field $H_0$ and having a nuclear magnetic resonance frequency $f_0$, and means disposed in close proximity to said target area for focusing one or both of said magnetic fields thereon, and relates to a method of obtaining, with a high signal to noise (SN) ratio and with ease, information of a specified area of a living body from the outside or inside of the body.

7 Claims, 32 Drawing Figures

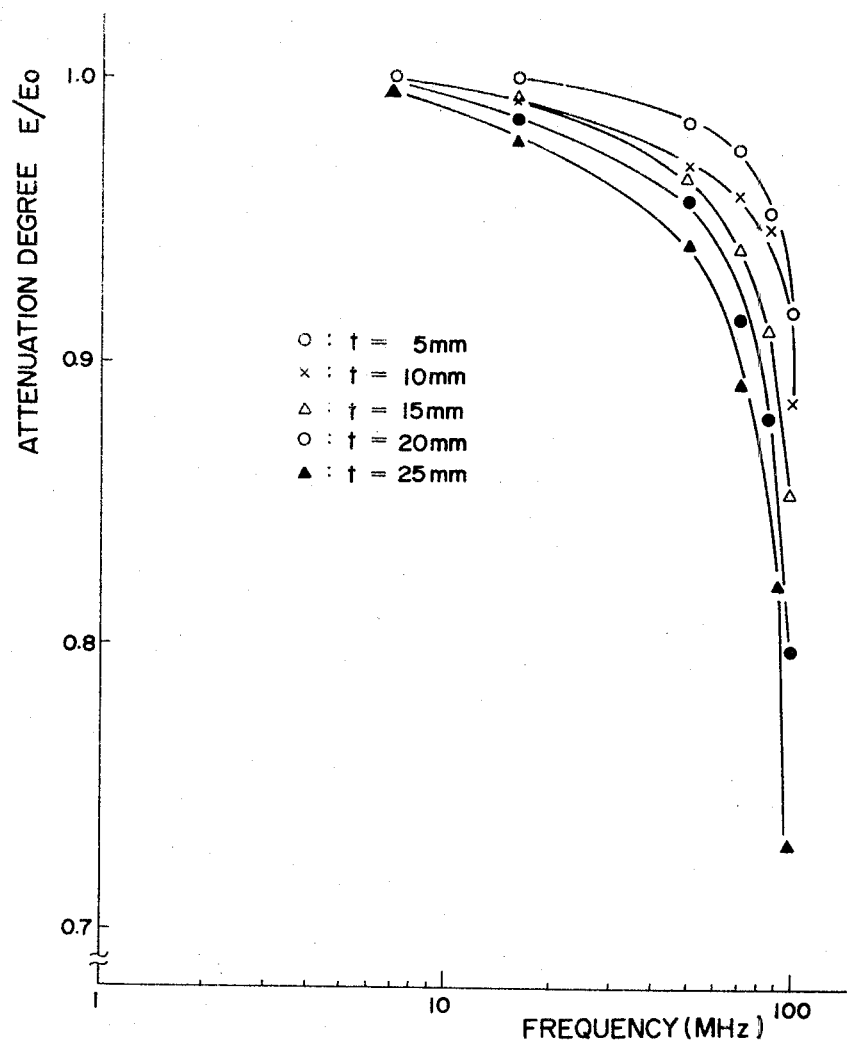

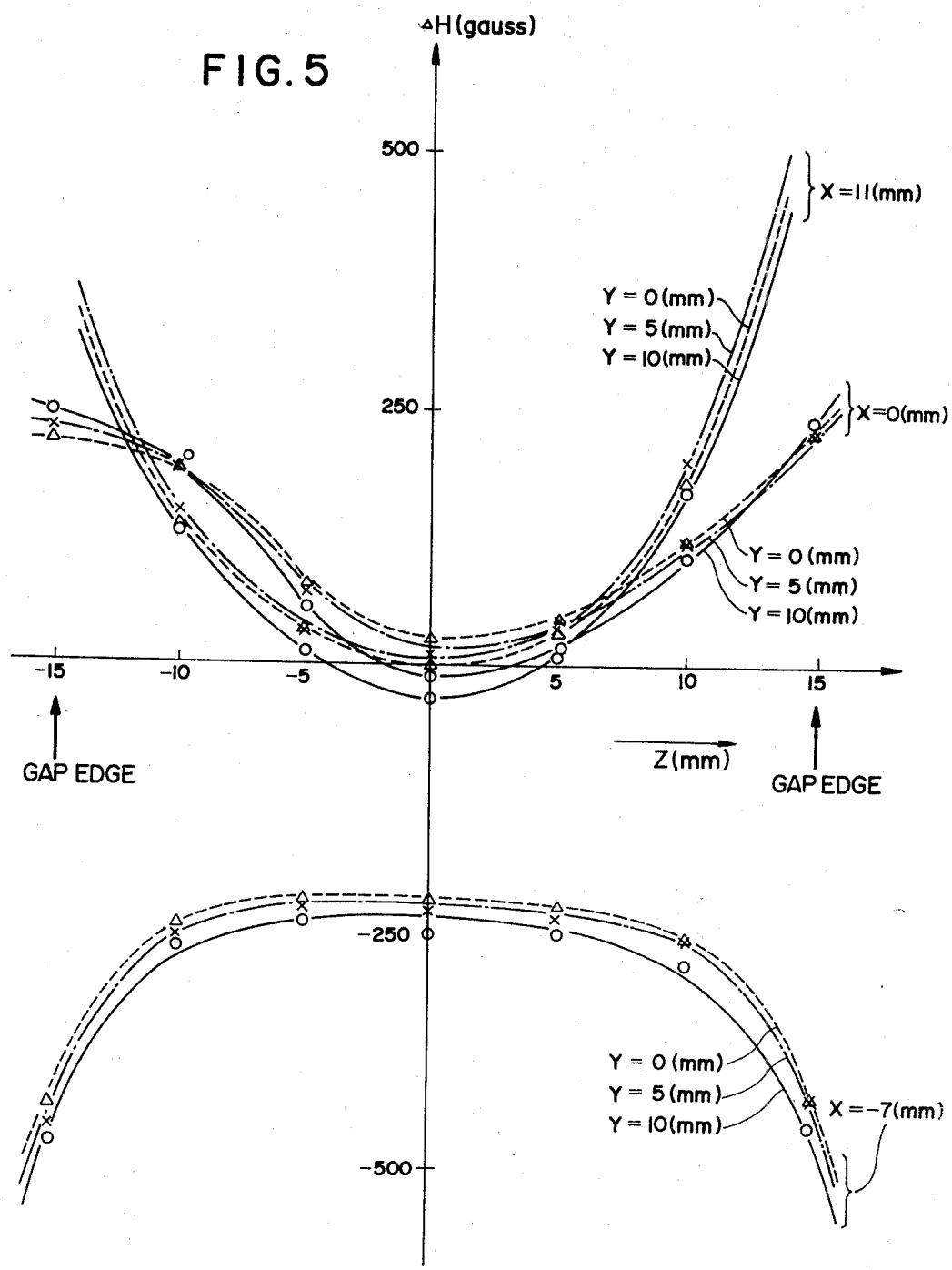

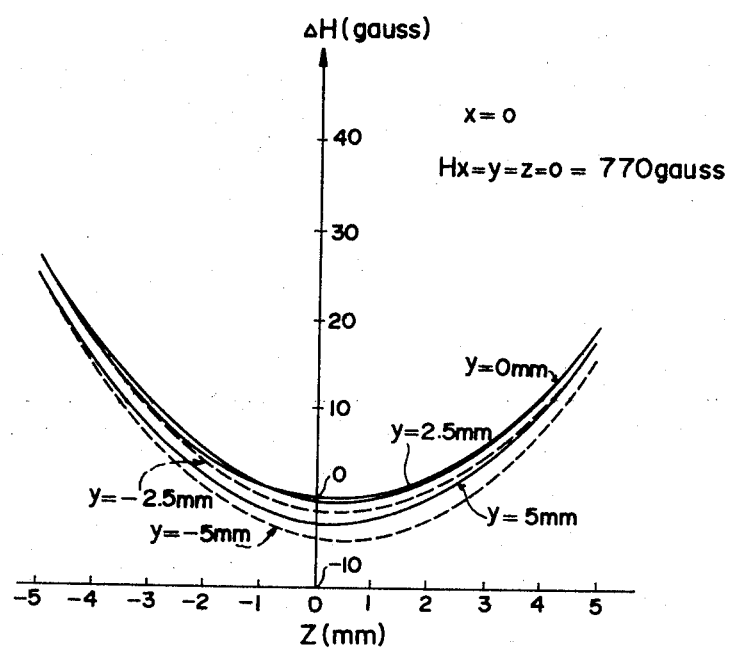

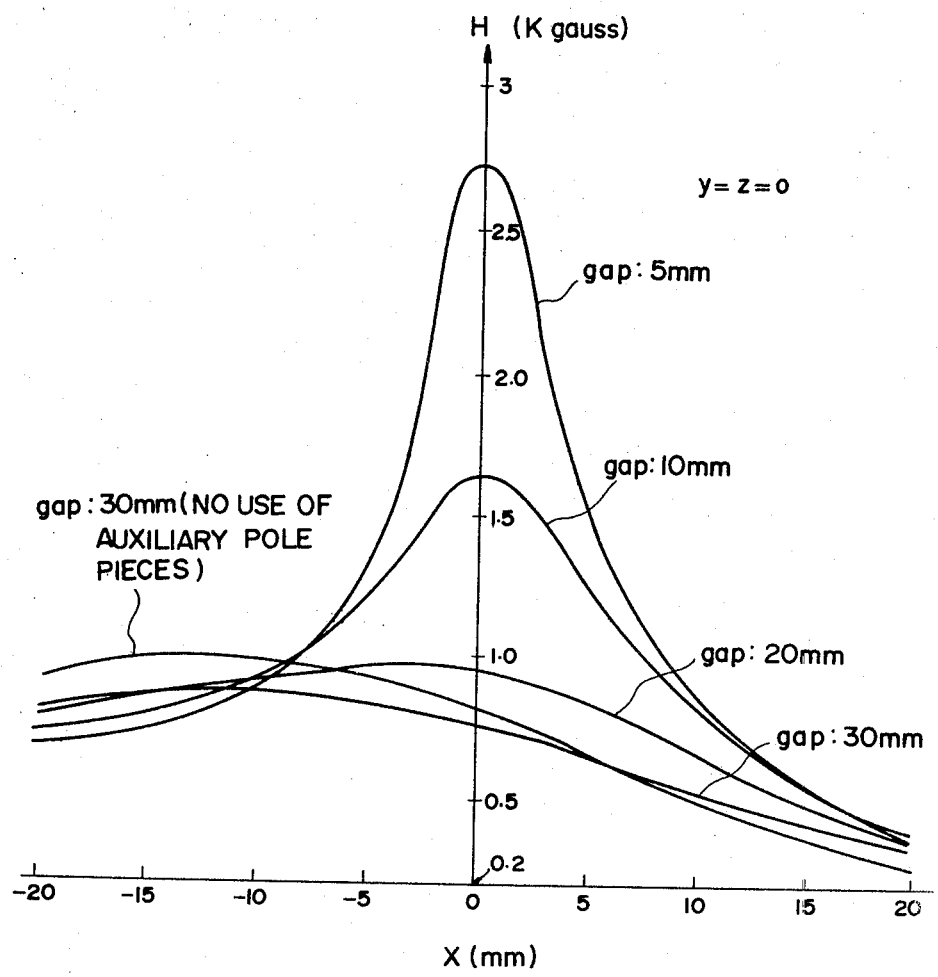

FIG.15A 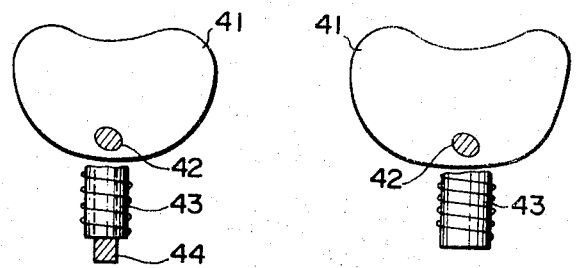 FIG.15B

FIG.18A 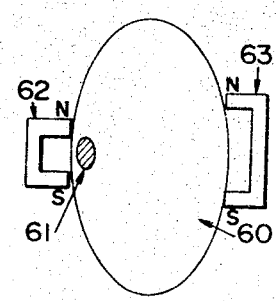 FIG.18B 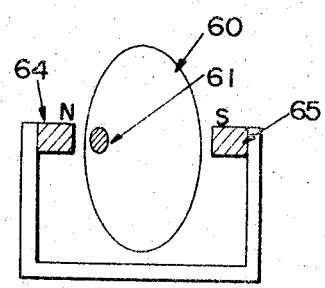

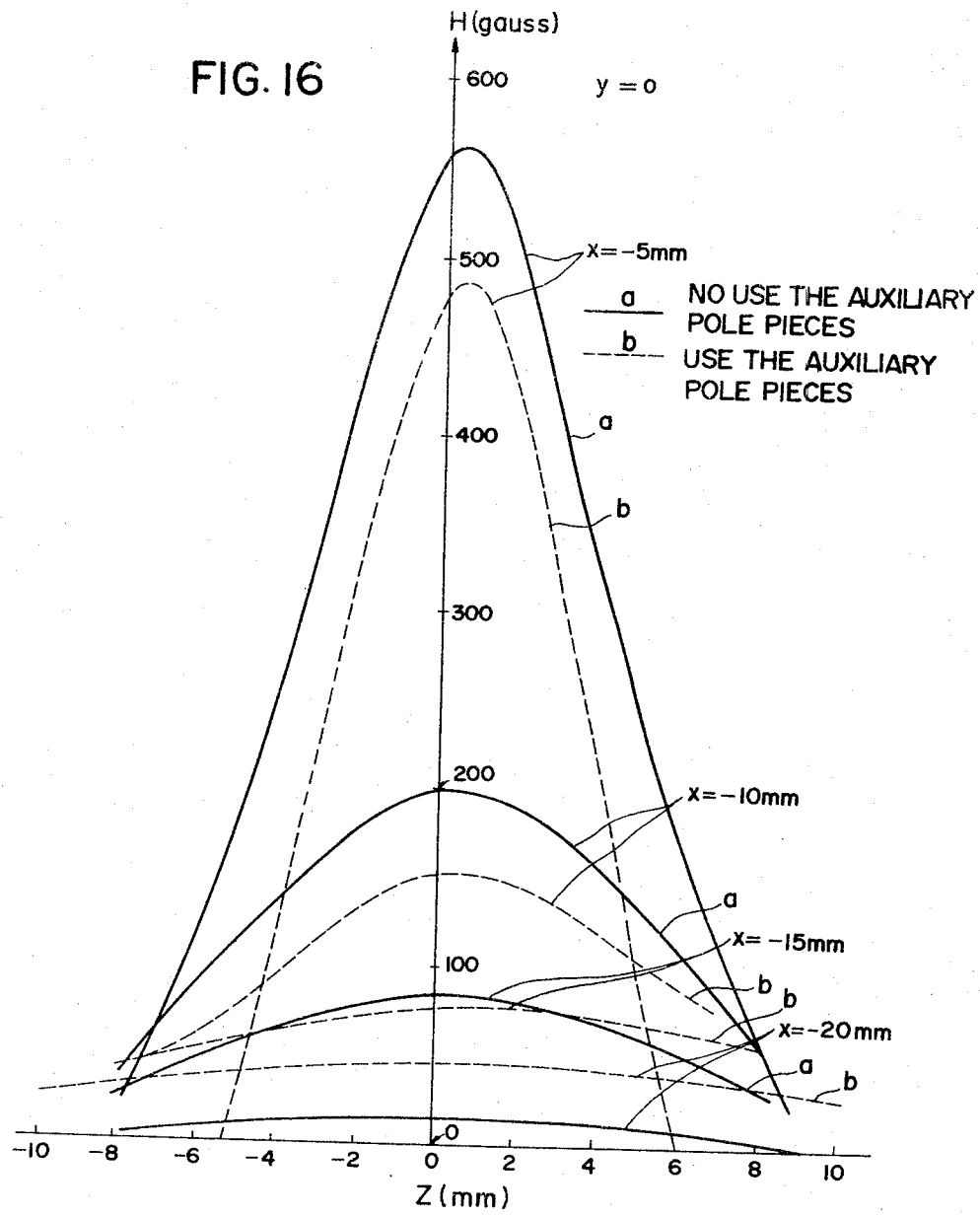

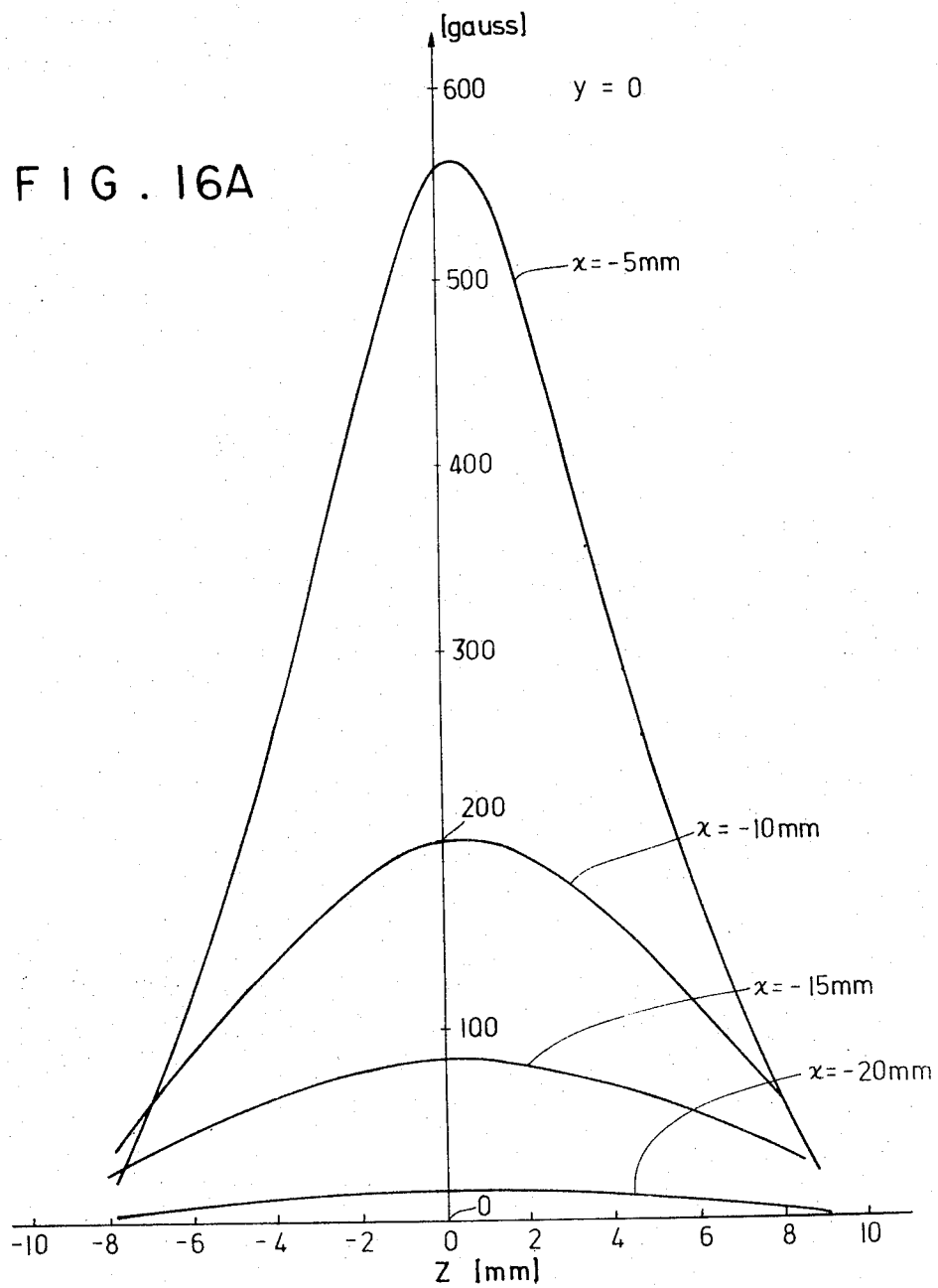

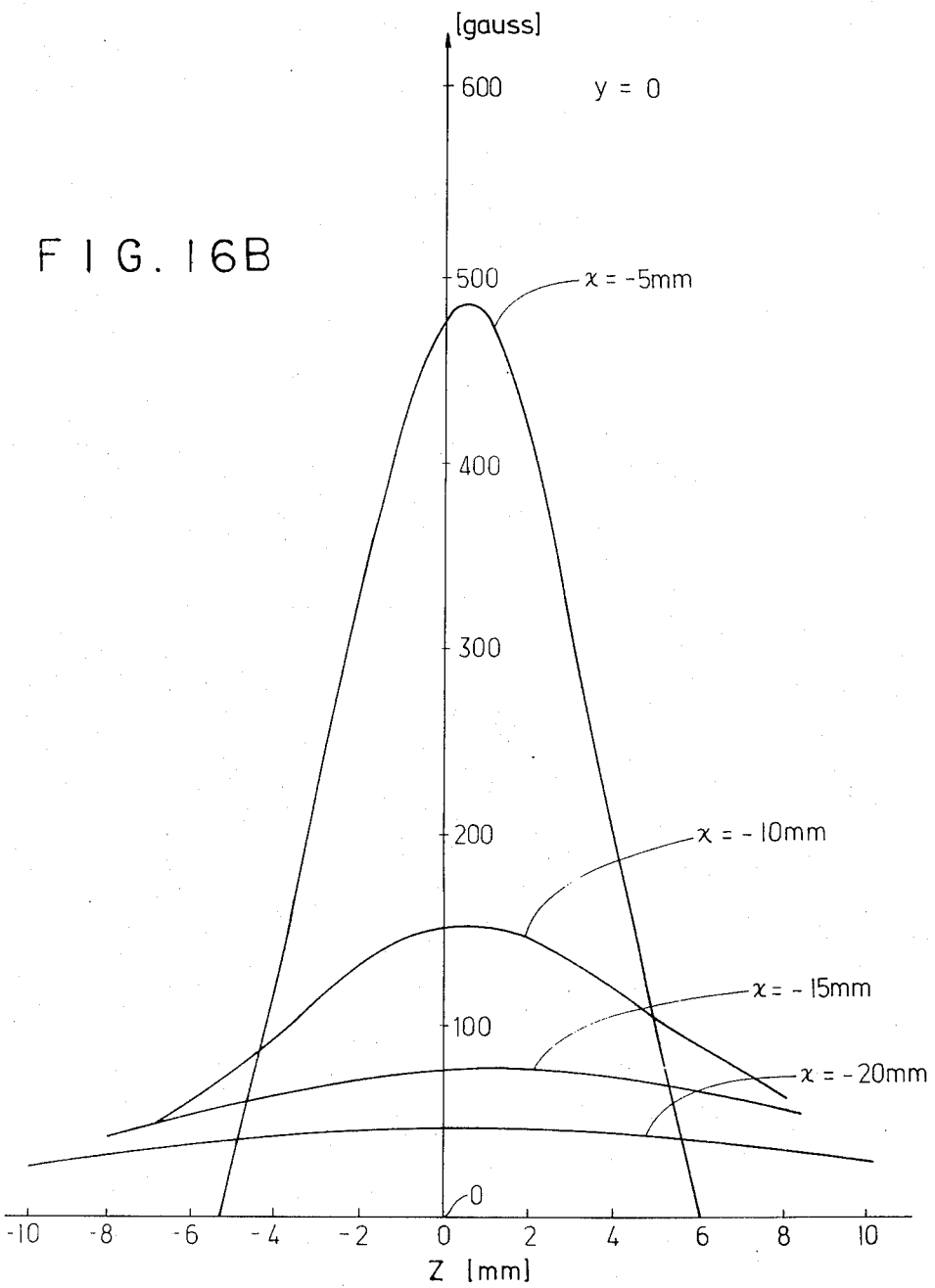

METHOD OF OBTAINING INFORMATION OF A SPECIFIED OR TARGET AREA OF A LIVING BODY NEAR ITS SKIN SURFACE BY THE APPLICATION OF A NUCLEAR MAGNETIC RESONANCE PHENOMENON

This is a continuation of application Ser. No. 653,734 filed Jan. 30, 1976, now abandoned.

BACKGROUND OF THE INVENTION

1. Field of the Invention

This invention relates to a method of obtaining information of a specified or target area of a living body near its skin surface by the application of a nuclear magnetic resonance (hereinafter referred to as NMR) phenomenon. More particularly, the invention relates to a method of obtaining, with high SN ratio and with ease, information of a specified area of a living body near its skin surface by a measuring instrument directly inserted into the body to approach the specified area or disposed on the skin surface in close proximity thereto.

In concrete terms, the present invention is directed to a measuring method which enables endoscopy of a specified area of a living body or approach thereto from the outside of the body for obtaining high-resolution information on liquids such as intracellular or extracellular sap, various tumors (a benign tumor, a malignant tumor, an inflammatory tissue, etc.) through the medium of an NMR signal of a nuclear magnetic substance (a proton, fluorine, magnesium, phosphorus, sodium, calium or the like) in an organ close to the skin surface of the body (for example, a mammary gland or the thyroid gland), a tubular or cavitary organ (for example, the womb, an intestine, the throat or the like) or an organ incised by a surgical operation or the like. This method is applicable not only to a living body but also to a lifeless target. However, the following description will be made in connection with a living body for convenience of explanation.

2. Description of the Prior Art

For the above mentioned tumor dectection, techniques heretofore employed have included radiometry using X-rays or RI, ultrasonic measurement, and a method of histomorphologically examining a tissue slice sampled by biopsy through a microscope. Further, methods of obtaining information of a specified area of a living target body from the outside thereof by the application of the NMR phenomenon have recently been proposed by the present inventors (U.S. Pat. No. 3,932,805) and R. Damadian (U.S. Pat. No. 3,789,832).

With radiometry, an abnormality of the target area is recognized merely as a "shadow" and the qualitative judgement as to whether the abnormality is a tumor or not, or whether it is benign or malignant, is finally made after a histomorphological examination. The same may be said of the ultrasonic measurement. Further, it is known that the limit of resolution by which an abnormal area in an X-ray or RI image can be discerned is a volume of about 1 ml even by a highly skilled person. Moreover, in the case of sampling the tissue slice from the target body, the sampling process inflicts pain and injury on the target body. Further more, since the sample is taken out from the body, the measurement is carried out under different conditions from those in the body resulting in serious errors and a large amount of time is required for obtaining the results of examination.

On the other hand, the methods of obtaining internal information of a target body from the outside thereof by the application of the NMR phenomenon has a great advantage as a non-invasive method. However, in the case of obtaining information of a specified or target area deep in the body, where the specified area and a signal detector disposed on the outside of the body are spaced more than several centimeters apart from each other, the coupling between them becomes inevitably loose. And, further, the SN ratio of the measuring device is lowered by signal loss due to body tissues existing between the specified area and the signal detector. For enhancement of the SN ratio, it is necessary to employ as strong a magnetic field as possible and it is known that the SN ratio is improved in proportion to substantially the 1.5 power of the field intensity.

Moreover, it is also necessary to use means for erasing pseudo-signals emanating from the region neighboring the specified area, so that the device is inevitably complicated and bulky.

SUMMARY OF THE INVENTION

It is an object of the present invention to provide a method of easily obtaining with high resolution NMR information in a specified area of a living target near its skin surface from the outside thereof or in the inside thereof in a very short time substantially without inflicting pain or injury on the living target so as to eliminate the abovesaid difficulties of the prior art methods in practical use.

With the method of this invention, since a measuring device can be easily approached to a specified or target area, it is possible to avoid lowering of the output from the measuring device resulting from loose coupling of its signal detector with the target area and attenuation of the output due to body tissues existing between the signal detector and the target area. Accordingly, information on various liquids or a tumor can be easily obtained with high resolution not only in a consultation room but also during an operation.

BRIEF DESCRIPTION OF THE DRAWINGS

FIG. 3 is a graph showing the results of measurement of the output attenuation degree relative to frequency in the case of a body tissue existing between the signal detector and the target area;

FIG. 5 shows one example of magnetic field distributions inside and outside of the air gap of the magnet depicted in FIG. 4;

FIGS. 7A to 7C are graphs respectively showing improved examples of magnetic field distributions in the same plane in the cases of the magnet of FIG. 4 using the auxiliary pole pieces of FIG. 6, FIG. 7A showing the magnetic field distribution of the magnet itself in the case of using no auxiliary pole pieces, FIG. 7B showing the magnetic field distribution in the case of using the square pole pieces of FIG. 6A and FIG. 7C showing the magnetic field distribution in the case of using the wedge-shaped pole pieces of FIG. 6B;

FIG. 10 is a graph showing examples of strong magnetic fields generated in the case of employing the inverted wedge-shaped auxiliary pole pieces;

FIGS. 15A and 15B are diagrams for explaining a strong field generating method and a homogenous weak field generating method, respectively;

FIG. 16 is a graph showing the distribution of a weak field at the back of a magnet for use in a two-field method, FIG. 16A showing the magnetic field distribution at the back of the magnet and FIG. 16B showing the magnetic field distribution in the case of mounting an auxiliary pole piece on the back of a magnet;

FIG. 18A is a diagram showing an arrangement of magnets disposed with their magnetic poles of the same polarity in opposing relation to each other;

FIG. 18B is a diagram showing an arrangement of a magnet with its magnetic poles in opposing relation to each other;

DESCRIPTION OF THE PREFERRED EMBODIMENTS

With reference to the drawings, the principles and features of this invention will hereinafter be described.

Where a nuclear magnetic substance such as a proton in water is placed in a homogeneous static field (having an intensity of $H_0$ gauss), its resonance frequency $F_O$ is given by the following equation:

$$f_0 = \gamma H_0/2\pi \qquad (1)$$

where $\gamma$ is the nuclear gyromagnetic ratio. In the case of the proton, $\gamma = 2.68 \times 10^4 \sec^{-1} \text{gauss}^{-1}$. For observing the resonance phenomenon, a radio-frequency magnetic field $H_1$ is applied in a direction perpendicular to the static field $H_0$. In this case, the motion of the nuclear magnetism is given by the Bloch's equation. Particularly, magnetization $M_y$ producing a resonance signal in a steady state is given by the following equation:

$$M_y = \gamma H_1 T_2 M_0 / (1 + \gamma^2 H_1^2 T_1 T_2) \qquad (2)$$

where $M_0$ is magnetization for thermal equilibrium. Further, it is also well-known that when the nuclear magnetic substance shifts from its certain thermal equilibrium state to another equilibrium state, it exhibits a transient state in which a spin-lattice relaxation time ($T_1$) and a spin-spin relaxation time ($T_2$) are time constants.

A resonance signal obtained in practice is an electromotive force which is induced by the aforesaid magnetization in a detector. Since the magnetization is in proportion to the volume of a sample to be measured, the amount of the sample can be measured from the amplitude of the resonance signal. Further, it is also known that since the abovesaid relaxation times $T_1$ and $T_2$ are related to the coupling state and constitution of molecules, they are indicative of qualitative information of the sample. Accordingly, from these parameters, it is possible to obtain the amounts of various liquid distributed in a living body, information on a tumor, etc.

Figure 1:
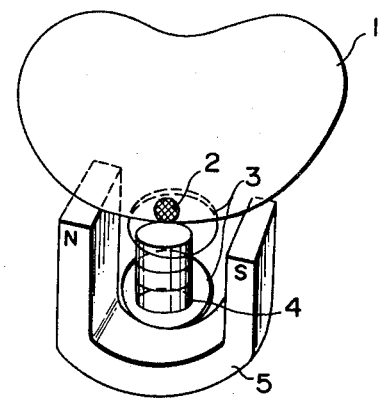
FIG. 1 schematically shows the construction of a measuring device of a specified area near the skin surface of a target body.

Referring now to FIG. 1, a first embodiment of this invention will be described. FIG. 1 schematically illustrates one example of a measuring device for investigating an area neighboring the skin surface of a body to be investigated from the outside thereof. In FIG. 1, reference numeral 1 indicates a body to be investigated; 2 designates an area close to the skin surface of the body 1 which is to be examined (hereinafter referred to as the target area); and 3, 4 and 5 identify elements respectively making up a miniature measuring device, which are respectively a radio-frequency field generator, a signal detector and a static field generator. The elements 3, 4 and 5 are disposed with their axes perpendicular to one another. (It is sufficient only that they are effectively perpendicular to one another.) Of course, the function of the radio-frequency field generator 3 can be performed by the signal detector 4, too.

If the radius, the length and the number of turns of a coil of the signal detector 4 are respectively taken as a, b and N and if the distance between the signal detector 4 and the target area 2 is taken as X, the output E from the signal detector 4, which is obtained by detecting the magnetization $M_y$ produced in the target area 2 due to the static field $H_0$ by the static field generator 5 is given by the following equation:

$$E = \frac{M_y \omega_0 N}{2b} [\{(X + b)/\sqrt{a^2 + (X + b)^2}\} - \{X/\sqrt{X^2 + a^2}\}]\sin(\omega_0 t + \theta) \qquad (3)$$

where $w_0 = \omega H_0 = 2\pi f_0$.

Figure 2A:
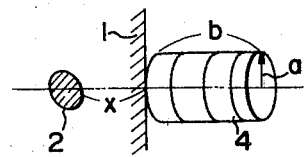
FIGS. 2A and 2B are respectively a diagrammatic showing of the relative arrangement of a signal detector to the target area and a graph showing the result of calculation of the attenuation degree of the output from the signal detector resulting from loose coupling of the target area and the signal detector.
Figure 2B:
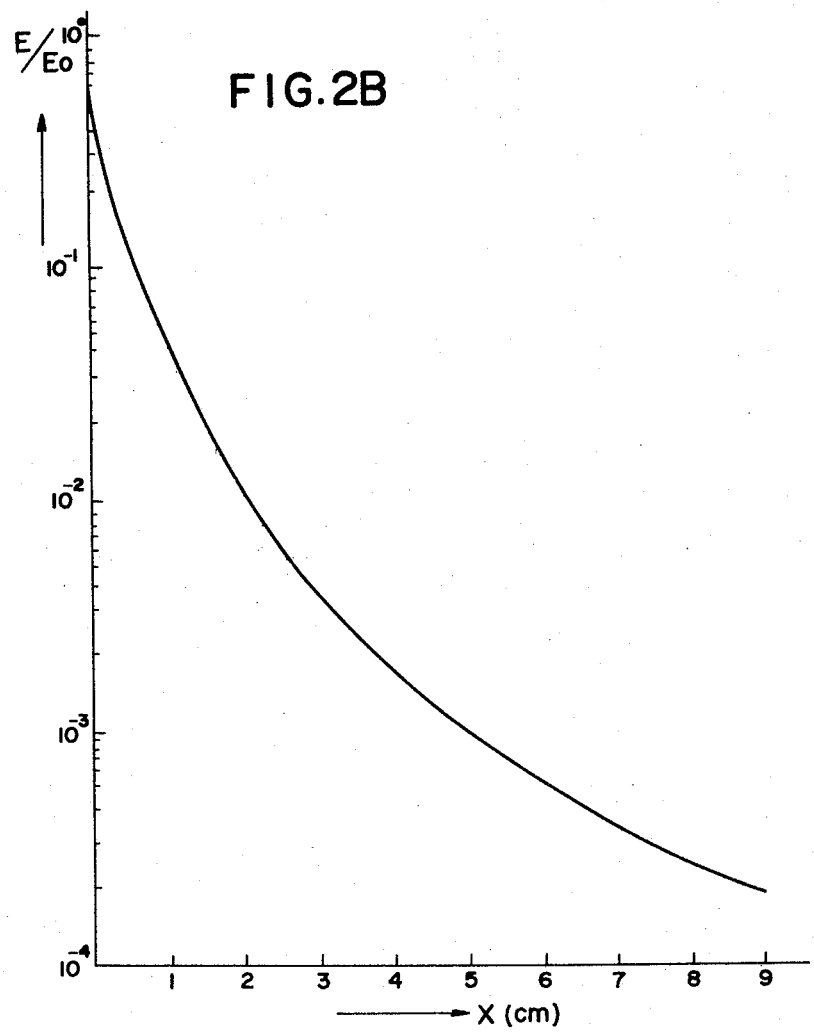

For example, if the coil of the signal detector 4 has a radius of 0.5 cm and a length of 1 cm in such an arrangement as shown in FIG. 2A, the relationship of the distance X between the target area and the signal detector 4 to the output E, obtained from the equation (3), is such as shown in FIG. 2B. In FIG. 2B, the output $E/E_0$ is normalized by an output $E_0$ obtained in the case where the target area is included about the signal detector. Generally, in the case where an area close to the skin surface such as the womb, the thyroid, the throat or the like is the target to be investigated, the detector can be disposed as close to the target area as about 1 cm. On the other hand, in the case of an organ deep in the body such as the kidney or the like, the distance between the detector and the target area is about 7 cm. Accordingly, in the case where the target is in the vicinity of the skin surface, the output is approximately 100 times larger than that in the case of the target area being deep in the body, as is evident from FIG. 2B.

FIG. 3 shows the influence of body tissue between the detector and the target area, which was examined by model experiments utilizing mutual induction. In FIG. 3, the thickness t of the body tissue is used as a parameter and the relationship between the output frequency and the attenuation degree of the output is shown. FIG. 3 indicates that the output decreases with an increase in the frequency and in the thickness of the body tissue.

In the case where an organ deep in the body was investigated in the presence of the static field $H_0 \approx 14$ Kgauss (the resonance frequency $f_0 \approx 60$ MHz at this time) as is the case with an NMR device which is presently on the market, the resolution is about 0.3 ml according to the results of calculations (Biological and Clinical Effects of Low-Frequency Magnetic and Electric Fields, C. C. Thomas, Springfield, Ill. 1974, pp. 295-317 edt. J. G. Llaurado et al).

In a simple device, however, it is practical that the static field $H_0$ is in the range of 1 to 5 Kgauss (the resonance frequency $f_0$ is in the range of 6 to 30 KH$_z$). The following Table 1 shows resolution in the cases of areas neighboring the skin surface investigated in the presence of the static field $H_0$ in the abovesaid range, obtained based on the results shown in FIG. 2B and the performance of the device on the market.

TABLE 1

| Distance between signal detector and target area (Xcm) | Attenuation degree of output $E/E_0$ | Resolution in the cases of target areas neighboring skin surface Resolution (ml) | | |
|---|---|---|---|---|
| | | $H_0 = 5$ Kgauss | $H_0 = 3$ Kgauss | $H_0 = 1$ Kgauss |
| 0 | $6 \times 10^{-1}$ | $8.5 \times 10^{-3}$ | $17 \times 10^{-3}$ | $85 \times 10^{-3}$ |
| 0.5 | $1.5 \times 10^{-1}$ | $34 \times 10^{-3}$ | $67 \times 10^{-3}$ | 0.34 |
| 1.0 | $5 \times 10^{-2}$ | 0.1 | 0.2 | 1.0 |

It is generally known that the SN ratio in the NMR phenomenon is in proportion to the 3/2 power of the static field $H_0$. In the case where the static field $H_0$ is 1 to 5 Kgauss, the SN ratio is inevitably lower than that in the case of the static field $H_0$ of 14 Kgauss. In the device according to this invention, however, the detector can be disposed close to the area to be investigated as described previously, and accordingly the number of body tissues between them can be reduced, so that where $X \approx 1$ cm and $H_0 = 3$ Kgauss, it is possible to obtain resolution 10 times higher than that obtainable with radiometry. This indicates that even with the simple device, it is possible to obtain resolution equal to that obtainable with the NMR method for investigating organs deep in the body by the use of the static field $H_0$ of 14 Kgauss. In the case where the static field $H_0$ is 1 Kgauss, resolution approximately equal to that obtainable with radiometry is obtained.

A first problem to be solved for realizing the simple device according to this invention concerns the construction of the static field generator, that is, how to concentrate a strong static field on the target area and how to enlarge, reduce and shift the region of a homogeneous field and the region of concentration of the strong static field.

A second problem is the manner of generation of the radio-frequency magnetic field $H_1$ for increasing the SN ratio of the target area. This problem will be described later on.

A third problem is how to bring the measuring device or the signal detector close to the target area which is a signal source to maximize the input to the measuring device or the signal detector.

A discussion will be given first in connection with the first problem. A first solution of this problem is to mount a ferromagnetic auxiliary pole piece made of an appropriate configuration on each magnetic pole of a magnet of the static field generator.

Figure 4:
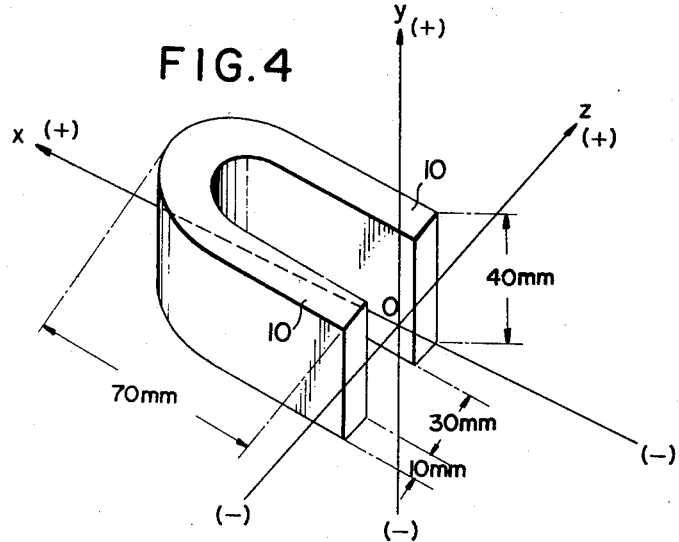
FIG. 4 shows the construction and the axis of coordinates of a horseshoe-shaped magnet.

At first, the magnetic field distribution inside and outside of the air gap between magnetic poles 10 of such an ordinary horseshoe-shaped permanent magnet as shown in FIG. 4 which has no auxiliary poles, is examined. The dimensions of the magnet are as indicated in FIG. 4. The results of measurement of the magnetic field in the z-axis direction are shown in FIG. 5, in which the ordinate represents a deviation ($\Delta H$) from the field intensity (905 gauss) at the center 0 of the plane including the end faces of the magnetic poles. It is seen from FIG. 5 that a relatively homogeneous magnetic field exists not only at the central portion of the plane including the end faces of the magnetic poles but also on the outside of the air gap between the magnetic poles, for example, as in the case of the distance X being $-7$ mm. Next, a description will be made of the case where auxiliary pole pieces of a ferromagnetic material are mounted on the magnetic poles of the magnet exhibiting such a magnetic field distribution.

FIGS. 6A to 6D illustrate typical configurations of the auxiliary magnetic pole pieces. Namely, FIGS. 6A to 6D respectively show rectangular or square, wedge-shaped, inverted-wedge-shaped and hemispherical auxiliary pole pieces 11, 12, 13 and 14 mounted on the both magnetic poles of the magnet. In order to clarify the effects which would be produced by these auxiliary pole pieces, the magnetic field distributions of the horseshoe-shaped magnet shown in FIG. 4 were measured in connection with the cases of using the rectangular and wedge-shaped auxiliary pole pieces 11 and 12 ($10 \times 10 \times 40$ mm) of pure iron depicted in FIGS. 6A and 6B, respectively and of using no auxiliary pole pieces.

Figure 7A:
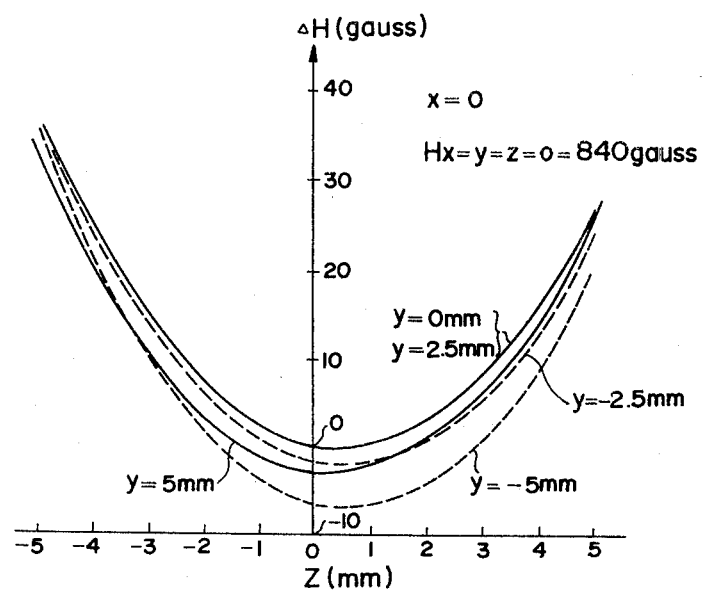
Figure 7B:
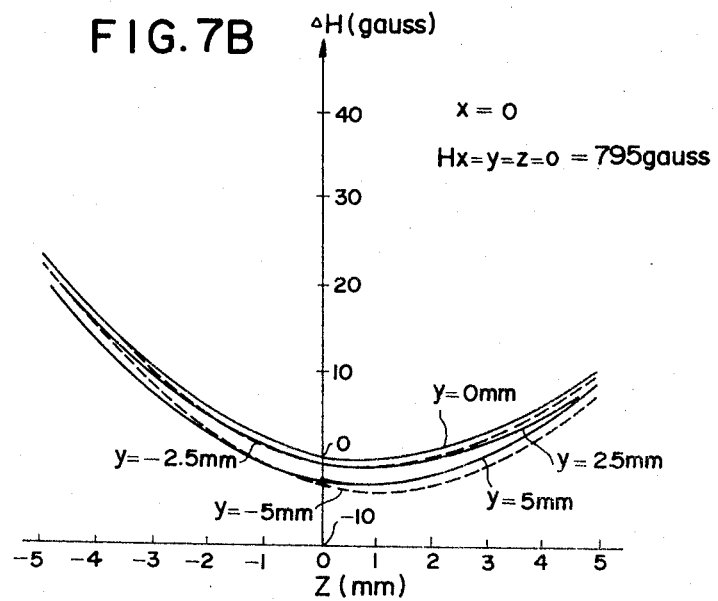

FIGS. 7A to 7C each show the result of measurement of the magnetic field in the z-axis direction in the magnetic pole end face plane including the center 0 of the pole gap ($X=0$, $-5$ mm $\leq z \leq 5$ mm, $-5$ mm $\leq y \leq 5$ mm) in the above three cases. The auxiliary pole pieces are mounted in such a manner as not to change the pole gap length, and the magnetic field at any position is indicated in the form of the deviation ($\Delta H$) from the field intensity at the pole center of the magnet ($x=y=z=0$). FIG. 7A to 7C respectively show the magnetic field distributions in the cases of no auxiliary pole pieces, the rectangular pole pieces and the wedge-shaped ones having an inclination of 45°. From the graphs, it is seen that, in the area of $-5$ mm $\leq z \leq 5$ mm, the use of the auxiliary pole pieces improves homogenuity of the magnetic field about twice.

Figure 8A:
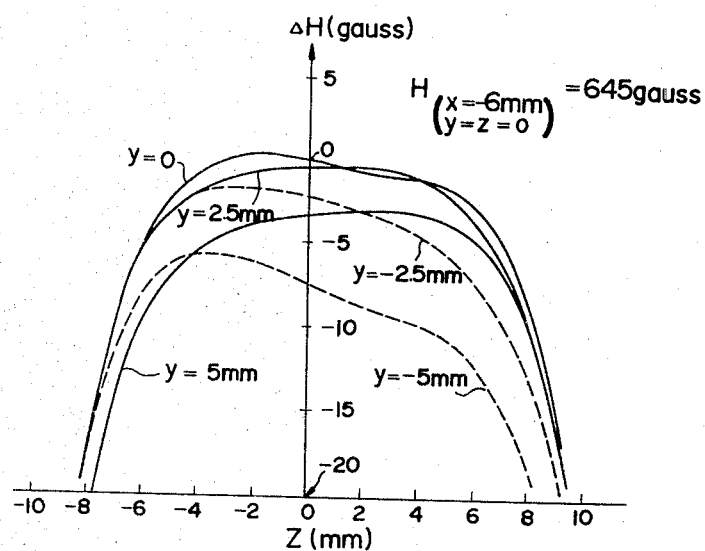
FIGS. 8A to 8C are graphs respectively showing the magnetic field distributions in planes of the highest field homogeneity, corresponding to FIGS. 7A to 7C, respectively.
Figure 8B:
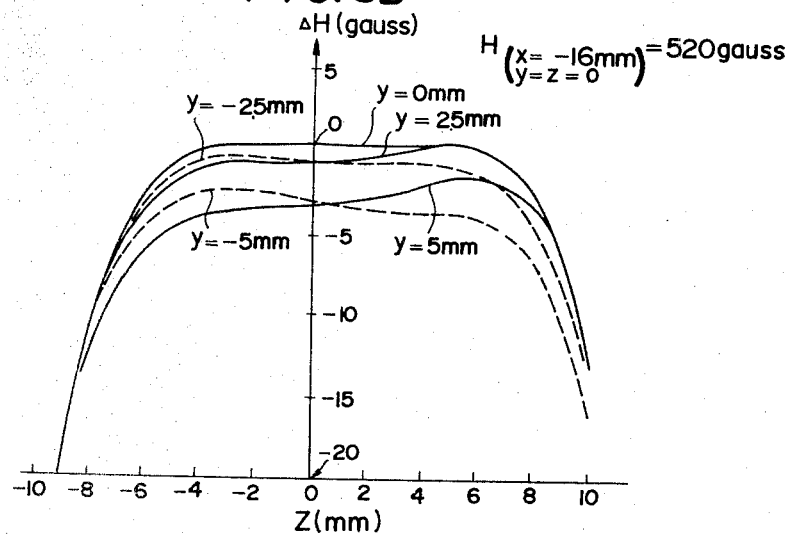
Figure 8C:
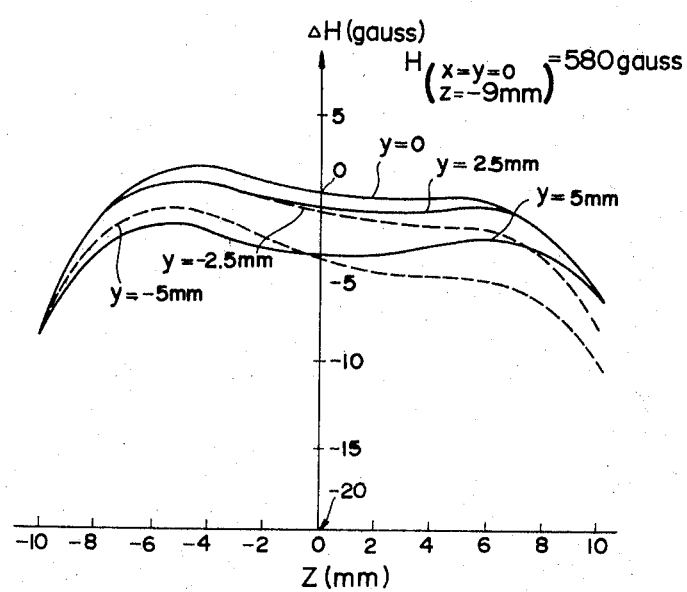

FIGS. 8A to 8C each show the results of measurement (ΔH) of the magnetic field distribution in a plane where the magnetic field is the most homogeneous outside of the pole end face plane (X<0) in each of the above three cases. FIGS. 8A to 8C indicate that homogeneity of the magnetic fields in the areas $-5$ mm$\leq z \leq 5$ mm and $-7.5$ mm$\leq y \leq 7.5$ mm is further improved by the use of the auxiliary pole pieces as is the case with FIG. 7. In the cases of FIG. 8A in which no auxiliary pole pieces are used and FIG. 8B in which the rectangular pole pieces are used, a magnetic field characteristic of excellent homogeneity is obtained at substantially the same position (in the case of FIG. 8A, $x = -6$ mm and, in the case of 8B, relative to the face plane of the magnetic pole (in FIG. 8A, the magnetic poles of the magnet and, in 8B, the auxiliary pole pieces). In the case of FIG. 8C employing the wedge-shaped pole pieces having the inclination of 45°, the homogeneous magnetic field region can be shifted to a position of $x = -9$ mm relative to the pole face plane of the magnet.

Figure 6A:
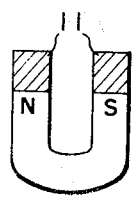
FIGS. 6A to 6D are schematic diagrams illustrating horseshoe-shaped magnets respectively having mounted thereon square, wedge-shaped, inverted-wedge-shaped and hemispherical ferromagnetic auxiliary magnetic pole pieces.
Figure 6C:
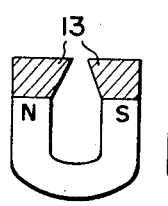
Figure 6B:
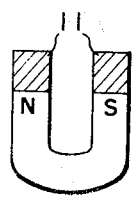
Figure 6D:
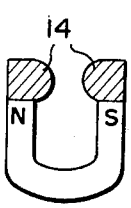
Figure 9A:
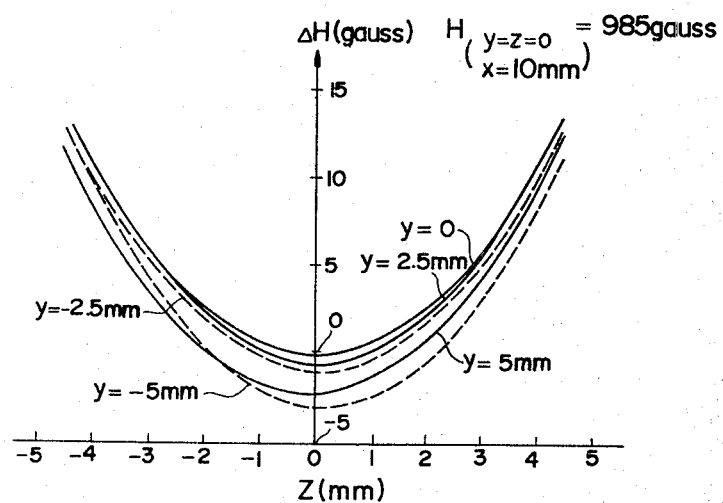
FIG. 9A is a graph showing homogeneous magnetic field regions in the case of employing no auxiliary pole pieces.
Figure 9B:
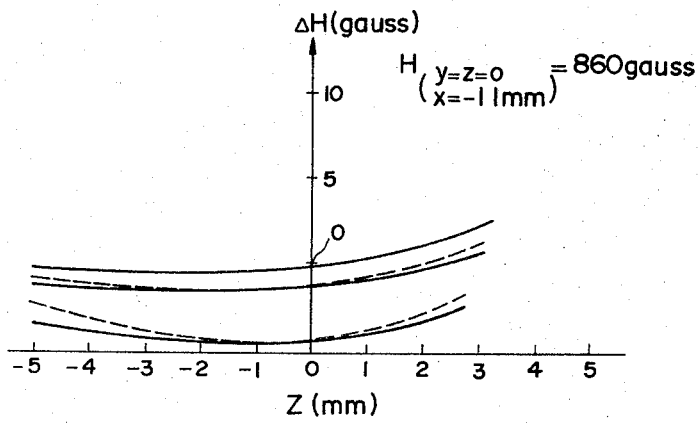
FIG. 9B is a graph showing homogeneous magnetic field regions in the case of employing the inverted-wedge-shaped auxiliary pole pieces.

FIG. 9B shows the magnetic field distribution in the region of the best homogeneity in the case of employing the inverted-wedge-shaped auxiliary pole pieces shown in FIG. 6C. A comparison of the magnetic field distributions (FIGS. 9A and 9B) at the same position in the case of employing no auxiliary pole pieces and in the case of using the inverted-wedge-shaped pole pieces indicates that, in the above case, a homogeneous magnetic field can be established in the magnetic air gap of the magnet ($x \approx 12$ mm) in contrast with the case of employing the wedge-shaped pole pieces shown in FIG. 8C.

From the above, it is apparent that the use of ferromagnetic auxiliary pole pieces of an appropriate configuration provides for enhanced homogeneity of the magnetic field and enables enlargement, reduction and shifting of its homogeneous region. The effects can be obtained for the following reasons: non-uniformity of the permeability of the magnet itself which is the main cause of disturbing the homogeneity of the magnetic field is smoothed by the ferromagnetic auxiliary pole pieces and magnetic flux paths in the vicinity of the air gap are changed by the high permeability and the shape of the ferromagnetic members. Accordingly, it is also possible to shift the homogeneous magnetic field region by appropriately changing the inclination of the wedge-shaped auxiliary pole piece in relation to the target area to be investigated.

Next, a description will be given of the method of focusing a strong magnetic field on a desired area by the use of the above mentioned wedge-shaped auxiliary pole pieces. FIG. 10 shows the relationship between the air gap length and the field intensity in the case of using such pole pieces. This graph shows the field intensity in the z-axis direction on the center axis of the air gap (the x-axis). From FIG. 10, it appears that a strong magnetic field can be produced by decreasing the air gap length and can be centered around the tips of the auxiliary pole pieces. This is an application of the so-called edge effect that magnetic fluxes center on pointed portions of the pole pieces. Accordingly, even by inserting a member having a pointed end such as a ferromagnetic injection needle into the target area, a strong magnetic field can similarly be centered around the tip of the needle. It can be readily seen by analogy that enhancement of homogeneity of the magnetic field and enlargement, reduction and shifting of the homogeneous field region can be achieved by the combination of the magnetic flux concentration due to the above stated edge effect with the air gap length providing a high magnetic resistance, for example, by employing auxiliary pole pieces, each having one convex or concave side of an appropriate curvature, such as the hemispherical auxiliary pole pieces shown in FIG. 6D.

A second solution of the above described first problem is the combined use of a ferromagnetic member or a hollow coil with a magnet for enhanced homogeneity of the static field intensity. That is, as is evident from the description given of the aforementioned first solution, enhancement of the field homogeneity and enlargement, reduction and shifting of the homogeneous field region can be achieved by appropriately controlling the flux paths, for example, through the use of the ferromagnetic auxiliary pole pieces described above. Accordingly, by disposing the auxiliary pole pieces inside and outside of the magnetic air gap instead of mounting them on the magnet, magnetic fluxes are focused on each ferromagnetic member which is high in permeability and consequently low in magnetic resistance. Therefore, the homogeneity of the magnetic field can be improved depending upon the shape of the ferromagnetic member and the position and the angle of the ferromagnetic member relative to the plane including the magnetic pole end faces. Of course, the ferromagnetic member can be replaced with a hollow magnetic coil and even by the magnetic field established by the coil, the paths of the magnetic fluxes emanating from the magnet can be altered. The number of such ferromagnetic members or hollow magnetic coils is not always limited to one but may be more than two and, further by the combined use of them, the effect can be heightened. Moreover, when magnetic coils are used, it is also possible to utilize a magnetic field which is cumulatively generated by currents of the same polarity applied to a plurality of coils or differentially generated by currents of opposite polarities applied to the coils, or a magnetic field which is produced by cumulatively and differentially applying currents to two windings wound on the same coil. It is a matter of course that this method can be applied as a two-field method described later on. Now, one example of the effect produced by the combined use of the hollow coil and a ferromagnetic member is shown in FIG. 11. FIG. 11B shows the magnetic field intensity in the axial direction of the hollow coil on its central axis but outside thereof and the field intensity in the case of a ferromagnetic core being inserted in the hollow coil. On the central axis of the hollow coil, the field intensity is the highest in the vicinity of the end face of the coil and decreases as the distance to the end face of the coil increases. Where the ferromagnetic core is inserted in the hollow coil, the magnetic field intensity on the central axis of the coil increases as a whole and this increase is remarkable especially on the end face of the coil. Namely, by the insertion of the core of high permeability, magnetic fluxes dispersing in the space outside of the coil are centered on the core, so that the magnetic flux density becomes high as compared with that in the case of the hollow coil. Of course, depending upon the dimensions of the coil (the radius, the length and the number of turn) and the value of an exciting current applied thereto, the field intensity in the vicinity of the end face of the coil can be altered and enlargement and reduction of the area of concentration of the magnetic field can also be achieved. Further, this method can be employed not only for the generation of the static field, but also for focusing of a radio-frequency field as in a second embodiment of this invention described later on, and for the generation of two magnetic fields in a third embodiment of this invention also described later on.

Next, the second embodiment of this invention which is the preferred embodiment will be described. This is related to the second problem previously referred to. This embodiment is constructed so that signals only from the target area to be examined are obtained by focusing the radio-frequency field $H_1$ on the target area in an inductive manner.

A first method is to dipose a short-circuiting coil of an extremely low resistance in the region neighboring the target area for preventing the radio-frequency field from entering the neighboring region or for making its intensity in this region, remarkably lower than that in the target area. It is known as the law of electromagnetic induction that when the radio-frequency field interlinks the short-circuiting coil, a current is generated in the coil in a direction of preventing interlinkage fluxes. Accordingly, in the cross-sectional area and at the back of the short-circuiting coil, the radio-frequency field $H_1$ applied by a radio-frequency field generator is reduced to substantially zero, so that no resonance signal is produced in the neighboring region other than the target area in front of the short-circuiting coil and, as a result of this, the SN ratio in the target area can be greatly enhanced. Since exactly the same results can also be obtained by disposing a short-circuiting plate in place of the short-circuiting coil, the short-circuiting plate will also be referred to as a short-circuiting coil. Its concrete example is related to a fourth embodiment of this invention, and hence will be described later on.

Figure 12:
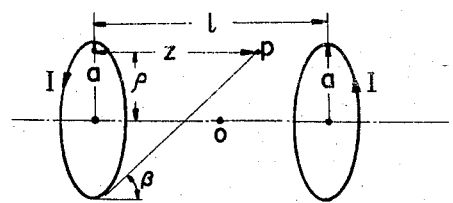
FIG. 12 illustrates an arrangement of a coil pair for radio-frequency field generation.

A second method for effecting the second embodiment that the magnetic field $H_1$ generated by the coil of the radio-frequency field generator is inductively focused on the target area or an area including the neighboring region. The range of focusing of the radio-frequency field established by a pair of one-turn coils as shown in FIG. 12 is examined. In FIG. 12, if the magnetic field in the axial direction of the coils (in the direction z) is taken as $Hz$, if the magnetic field in the coil diameter ($\rho$) is taken as $H\rho$ and if the composite magnetic field of the both fields is taken as $Hr$, they are expressed by the following equations at a point p:

$$Hz = \frac{I}{2\pi} [ \frac{1}{\sin\beta} \{K(\frac{2\sqrt{\rho/a}}{1+\rho/a}\sin\beta) + \frac{1-(\rho/a)^2 - (1+\rho/a)^2\cot^2\beta}{(1-\rho/a)^2 + (1+\rho/a)^2\cot^2\beta} E(\frac{2\sqrt{\rho/a}}{1+\rho/a}\sin\beta)\} + \frac{1}{\sin\beta} \{K(\frac{2\sqrt{\rho/a}}{1+\rho/a}\sin\beta) + \frac{1-(\rho/a)^2 - (1+\rho/a)^2\cot^2\beta}{(1-\rho/a)^2 + (1+\rho/a)^2\cot^2\beta} E(\frac{2\sqrt{\rho/a}}{1+\rho/a}\sin\beta)\}] \quad (4)$$

$$H\rho = \frac{I}{2\pi} [\frac{1+a/\rho}{\sin\beta}\cot\beta\{-K(\frac{2\sqrt{\rho/a}}{1+\rho/a}\sin\beta) + \frac{1+(\rho/a)^2 + (1+\rho/a)^2\cot^2\beta}{(1-\rho/a)^2 + (1+\rho/a)^2\cot^2\beta} E(\frac{2\sqrt{\rho/a}}{1+\rho/a}\sin\beta)\} + \frac{1+\rho/a}{\sin\beta}\cot\beta\{-K(\frac{2\sqrt{\rho/a}}{1+\rho/a}\sin\beta) +$$

$$\frac{1+(\rho/a)^2 + (1+\rho/a)^2\cot^2\beta}{(1-\rho/a)^2 + (1+\rho/a)^2\cot^2\beta} E(\frac{2\sqrt{\rho/a}}{1+\rho/a}\sin\beta)\}] \quad (5)$$

$$Hr = \sqrt{Hz^2 + H\rho^2} \quad (6)$$

Figure 14:
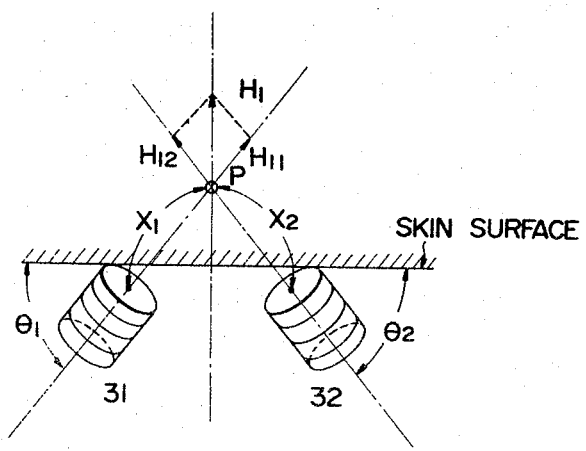
FIG. 14 illustrates one example of the arrangement of radio-frequency field focusing coil.
Figure 13:
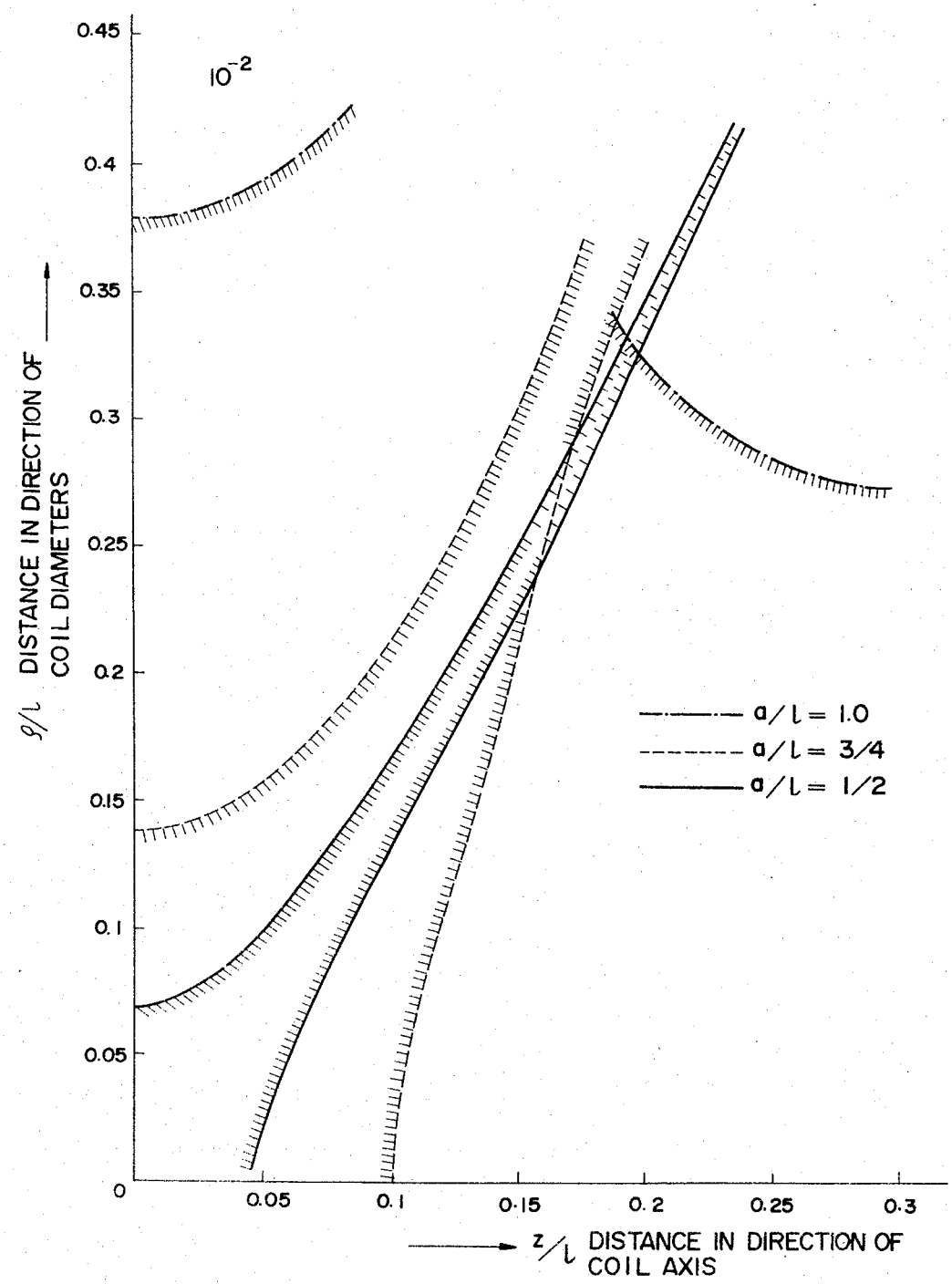
FIG. 13 is a graph showing examples of the focusing region of a magnetic field obtained with the coil arrangement of FIG. 12.

The range of the composite magnetic field Hr expressed by the equation (6), which has a deviation of less than 1% from the field intensity at the central point 0 between both of the coils, is such as shown in FIG. 13. FIG. 13 shows how the homogeneous field range (surrounded by oblique lines) varies with changes in the radii of coils, the distance (l) the therebetween being held unchanged. It is seen from FIG. 13 that the range of focusing of the homogeneous field can be changed by changing the radii of the coils. A horn-shaped projecting region extends from the central portion between both coils to the vicinity of each of them and it is believed that a pseudo-signal is generated from the area within this horn-shaped region. However, since nuclear magnetic substances such as protons do not exist in the horn-shaped region extending outwardly of the body to be investigated, no pseudo-signal is produced by focusing the homogeneous field at the central portion between the coils to the target area near the skin surface of the body to be examined. Further, as regards the horn-shaped region extending from the target area into the body to be examined, if only loose coupling between the signal detector and the target area is taken into account, the output is attenuated with substantially the inverse square of the distance between them, so that the pseudo-signal is almost negligible in this case, too. Consequently, only the signal from the target area can be detected with high SN ratio. Although this method has been described in connection with the case of generating a radio-frequency magnetic field, the method is similarly applicable to the generation of the static field, too. Further, also in connection with the horn-shaped projecting region produced by the magnet, the influence of the pseudo-signal is little as is the case with the method described above. The above has described the focusing of the radio-frequency magnetic field by the use of the one-turn coil pair for convenience of explanation but exactly the same results can be obtained with the use of a solenoid coil pair or the like. Based on the results described above and the effect of the auxiliary pole piece configuration in FIG. 6 on the static field generation, the method of focusing the radio-frequency magnetic field can be developed as follows: That is, as illustrated in FIG. 14, for example, two coils 31 and 32 of the same dimensions (their radii, lengths and numbers of turn being indicated by a, l and N, respectively) are disposed with their central axes crossing each other in the target area at a point p. Assume that the central axes of both of the coils are inclined at 45° ($\theta_1 = \theta_2 = 45°$) to the skin surface in FIG. 14 and that radio-frequency magnetic fields are generated by applying the same currents to the coils 31 and 32 in a cumulative manner (the currents being of the same polarity). In this case, if the distances between the end faces of the coils 31 and 32 and the point p are respectively taken as $X_1$ and $X_2$, magnetic fields $H_{11}$ and $H_{12}$ emanating from the coils 31 and 32 in their axial directions are given by the following equations:

$$H_{11} = \frac{NI}{2l} \left[ \frac{X_1}{\sqrt{a^2 + X_1^2}} + \frac{l - X_1}{\sqrt{a^2 + (X_1 - l)^2}} \right] \quad (7)$$

$$H_{12} = \frac{NI}{2l} \left[ \frac{X_2}{\sqrt{a^2 + X_2^2}} + \frac{l - X_2}{\sqrt{a^2 + (X_2 - l)^2}} \right] \quad (8)$$

Here, if $X = X_1 = X_2$, $H_{11} = H_{12}$. Further, since $\theta_1 = \theta_2 = 45°$, if a composite magnetic field of the magnetic fields $H_{11}$ and $H_{12}$ is taken as $H_1$, it follows that $$H_1 = \sqrt{H_{11}^2 + H_{12}^2} = \sqrt{2} \times \frac{NI}{2l} \left[ \frac{X}{\sqrt{a^2 + X^2}} + \frac{l - X}{\sqrt{a^2 + (X - l)^2}} \right] \quad (9)$$

Since the direction of the composite field $H_1$ is vertical to the skin surface, this field $H_1$ can be held at right angles to the static field $H_0$ and can be focused on the target area p. In the above, it is assumed that $\theta_1 = \theta_2 = 45°$ and that $X_1 = X_2$ but these relationships are changed to $\theta_2 \neq 45°$, $X_1 \neq X_2$, in accordance with the position of the target area and, in such a case, too, the same results as those described above can be obtained. It is ideal from the viewpoint of the SN ratio that the composite magnetic field $H_1$ crosses the static field $H_0$ at right angles thereto but if a little lowering of the SN ratio is permissible, the magnetic fields $H_0$ and $H_1$ need not always be so completely perpendicular to each other. Accordingly, it is also possible to measure an area neighboring the skin surface in a scanning manner by appropriately shifting the intersecting point of the central axis of both coils. Further, the magnetic field generating coils need not always be two and a combination of three or four coils can also be employed.

A third method for effecting the second embodiment is to insert a ferromagnetic core in the radio-frequency magnetic field generating coil for efficient focusing of the radio-frequency magnetic field on the target area. This method is basically identical with the static field focusing method employing the ferromagnetic core, described previously with regard to the first embodiment of this invention. In the case of focusing the radio-frequency magnetic field, however, it is necessary to minimize a high frequency loss due to the core. To this end, use is made of a material of, for example, the ferrite system so that the above loss is small. The formation of the above static field generating magnet of the so-called oxide such as the ferrite system material is also a solution to the problem of the high frequency loss.

Next, the third embodiment of this invention will be described. This embodiment is one application of the two-field method in which a strong static field $H_{0S}$ is focused on the target area in the neighborhood of the skin surface of the body to be examined to strongly magnetize the target area and a homogeneous weak static field $H_{0W}$ is applied to the target area only or an area including the target area and the neighboring area in place of the strong static field $H_{0S}$ to thereby measure a signal from the target area. In this case, the weak magnetic field may be applied simultaneously with the strong magnetic field. (The fields $H_{0S}$ and $H_{0W}$ are both static fields but differ in intensity from each other, and hence are indicated by different sufixes. The equibrium value $M_{0S}$ of magnetization of the target area exposed to the strong static field $H_{0S}$ which need not always be homogeneous is given by the following equation:

$$M_{0S} = x_0 H_{0S} \quad (10)$$

where $x_0$ is the magnetization factor. Since the intensity of the resonance signal to be detected is in proportion to the abovesaid value $M_{0S}$, it is desirable to magnetize the target area with as strong a static field as possible. On the other hand, for the detection of the resonance signal, as homogeneous a static field as possible is necessary. As described previously, the SN ratio in nuclear magnetic resonance is proportional to the 3/2 power of the static field intensity, so that it is desirable to use a strong field which is as homogeneous as possible. However, the main cause of disturbing the magnetic field homogeneity is that the permeability $\mu$ of the magnet material is non-constant and greatly scatters, as is well-known. Especially in the case of generating a strong magnetic field, unhomogeneity of the field due to the dispersion in the permeability $\mu$ increases. Accordingly, the homogeneous field can be obtained far easier with a weak magnetic field. In this case, however, the SN ratio is inevitably lowered as compared with that in a case of the strong magnetic field. A solution to this problem is to increase the signal component magnetization given by the equation (10) and to measure the signal in the homogeneous weak magnetic field without deteriorating the SN ratio. This is the feature of the two-field method. Further, since the weak field $H_{0W}$ is employed for the signal detection, the Larmor frequency is low, and consequently the loss due to the body tissue can be alleviated as compared with that in the case of using the strong field, as described previously with regard to FIG. 3. The problem to be solved is the manner of how to focus the strong static field on the target area and how to apply the homogeneous weak field to the target area.

A first solution of this problem is to obtain the strong magnetic field and the homogeneous weak field with a magnet or a coil. From FIG. 10 showing the results of measurement of the x-axis field intensity in the x-axis direction outside of the plane of the pole end face in the horse-shoe-shaped permanent magnet of FIG. 2 which does not employ the auxiliary pole pieces, described previously in connection with the first embodiment of this invention, it is seen that the field intensity at a position spaced 1 cm apart from the plane including the pole end faces is about $\frac{1}{2}$ that at the center O of the magnetic air gap ($H \approx 900$ gauss) and that the field intensity at positions spaced more than 3 cm apart from the place of pole end faces is approximately 10 times less than the field intensity at the center of the air gap and that the field homogeneity gradually increases as the distance to the plane of the pole end faces increases. Accordingly, in practical measurements, the target area is magnetized with the strong magnetic field in the vicinity of the center of the magnetic air gap and then the magnet is drawn apart from the body to be measured so that the homogeneous weak field may be applied to the target area. In the present method, if auxiliary pole pieces such as, for example, the wedge-shaped ones described with regard to FIG. 6, are employed, it is possible to focus a stronger magnetic field around the tips of the pole pieces as the air gap length decreases, as is evident from the results of measurement shown in FIG. 10. Further, even if the magnet is replaced with a coil, both magnetic fields can be produced. Namely, with such coil arrangements as shown in FIGS. 15A and 15B, the field intensity in the axial direction of a hollow coil 43 on its central axis when a constant current is applied to the coil and the field intensity in the axial direction of the coil 43 when a ferromagnetic core 44 is inserted in the coil, are such as shown in FIG. 11. Therefore, it is possible to apply a strong magnetic to a target area 42 of a body to be measured 41 by the coil having inserted therein the ferromagnetic core as shown in FIG. 15A and to remove the core (FIG. 15B) and then to detect a signal in the presence of the weak field by the hollow coil. For removing the core from the coil, an appreciably large amount of force is required. However, the core can be readily pulled out if the current to the coil is reduced to zero or decreased. The current value for generating the weak field after removal of the core may be the preceding one or a different one. The above method has been described in connection with the case of employing one coil for convenience of explanation but the coil arrangement of FIG. 14 described with regard to the radio-frequency focusing method in the second embodiment of this invention can be employed. With the arrangement of FIG. 14, a strong field can be focused on the target area by the coils, each having inserted therein the core, and then a homogeneous weak field can be focused on the target area by the coils after removing the cores therefrom.

The second method is to increase magnetization of the target area with a strong field by a magnet or a coil having inserted therein a core, to draw the magnet or the coil apart from the target area and to apply a homogeneous weak field for signal detection to the target area by another means. That is, the earth magnetic field existing at the place where the body to be examined is disposed, can be utilized as the weak magnetic field. The earth magnetic field is highly homogeneous and has an intensity of several hundred milligauss. Accordingly, it is known that the SN ratio is poor for obtaining an NMR signal only in the presence of the earth magnetic field and that a considerable volume of a sample is required. However, by previously magnetizing the target area with high intensity according to the method described above, a signal from the target area can be measured selectively and with high SN ratio, even if the homogeneous weak field is applied over a wide range including the target area. Further, it is also possible to employ, in place of the earth magnetic field, homogeneous magnetic field generating means of appropriate configuration and capacity such as an ellipsoid or sphere or a coil pair with which one or whole part of the body to be measured can be covered.

A third method is to produce a strong magnetic field in the air gap of a magnet in its forward portion or in the vicinity thereof and to provide a homogeneous weak magnetic field at the back of the magnet. In connection with the method of focusing the strong magnetic field on the target area, such a contrivance as the use of the auxiliary pole pieces and so on have already been described in the foregoing. Then, a description will be given first of the method of generating the homogeneous weak magnetic field at the back of the magnet.

The results of measurement of the magnetic field distribution in the neighborhood of the back of the ordinary horseshoe-shaped permanent magnet shown in FIG. 4 are shown in FIG. 16. In FIG. 16, the curve a shows the magnetic field distribution in the range of 5 mm$\leq$x$\leq$20 mm, y=0 and $-10$ mm$\leq$z$\leq$10 mm. This curve indicates that the field intensity at the back of the magnet is lower than that in front of the magnet (refer to FIG. 5) and that the field intensity decreases but the field homogeneity increases as the distance to the magnet increases. The curve b shows the magnetic field distribution in the case where the ferromagnetic pole pieces depicted in FIG. 6A were mounted on the magnet in such a manner as to provide an air gap length of 20 mm. This curve indicates that the use of the auxiliary pole pieces decreases a little the field intensity at the back of the magnet but further enhances the field homogeneity and enlarges the homogeneous field range. Accordingly, at the back of the magnet, too, there are obtained the same results as those obtainable with the use of the auxiliary pole pieces described previously with regard to the first embodiment of this invention. Further, it will easily be understood by analogy that the provision of a recess in the back of the magnet instead of employing the auxiliary pole pieces will provide exactly the same results as those obtainable with the auxiliary pole pieces.

A fourth method of producing the homogeneous weak magnetic field is to short-circuit or shield (hereinafter referred to as "short-circuit") the above recess in the back of the magnetic or the auxiliary pole pieces at the back of the magnet by means of a ferromagnetic member. At first, the strong magnetic field is produced in the air gap of the magnet in its forward portion or in the vicinity thereof as described previously. In the case where the magnetic pole at the back of the magnet is short-circuited by a ferromagnetic member, a magnetic flux shorting circuit of an extremely low magnetic resistance is formed, so that magnetic fluxes are focused on this ferromagnetic shorting circuit to lower the field intensity in the forward portion of the air gap of the magnet. For continuously generating the strong magnetic field, it is necessary to remove the ferromagnetic member for short-circuiting. In the case of an electromagnet, it is sufficient only to temporarily lower the exciting current or to reduce it to zero. Further, in the case of a permanent magnetic, a coil is mounted on the ferromagnetic coil for short-circuiting and when the ferromagnetic member is removed, a current is applied to the coil to produce a magnetic field opposite in polarity to the strong magnetic field.

A fourth embodiment of this invention is directed to a method of further enhancement of the SN ratio by approaching the measuring device to the target area.

A first method utilizes a mechanical force such as absorption or deaeration for approaching the target area to the measuring device. Namely, the methods of focusing the static field and the radio-frequency field on the target area have already been described in detail. For efficiently bringing the target area to the homogeneous magnetic field region or the strong magnetic field region established by such method, it is possible to mechanically pull in or approach the target area to the measuring device by the employment of an absorber together with the utilization of the afore mentioned auxiliary pole pieces. Accordingly, the distance between the signal detector and the target area can be further reduced to provide for enhanced SN ratio. This effect is more remarkable especially in a living body because it is viscous and resilient. Where the target area is close to the skin surface of the body to be examined, the absorber need not always be used but the measuring device may be pressed by hand against the skin surface.

Figure 17:
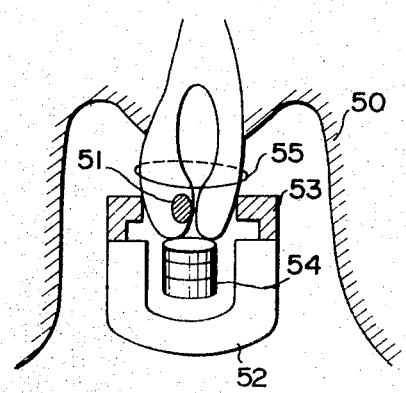
FIG. 17 illustrates one example of a method of approaching the measuring device to the target area.

A second method is to insert the target area into the air gap of a magnet to apply the static field and the radiofrequency field to the target area from a position close thereto and to detect a signal. An embodiment of this method is schematically shown in FIG. 17. FIG. 17 illustrates the case of measuring a target area 51 in the womb indicated by 50. In order that the target area 51 may be approached to a measuring device, auxiliary pole pieces 53 such as shown are mounted on the magnetic poles of a static field generating magnet 52 to facilitate insertion of the target area 51 into the magnetic pole gap. It will easily be seen from the description of the auxiliary pole pieces of FIGS. 6B and 6C that the auxiliary pole pieces 53 produce the effect of homogenizing the static field in the air gap portion, too. Further, by disposing the afore mentioned short-circuiting coil as indicated at 55, the radio-frequency field is prevented from entering deep into the body other than the target area 51 to provide for enhanced SN ratio. (In FIG. 17, no radio-frequency field generator is shown but it can be disposed in the same manner as shown in FIG. 1 and its function can be performed by the signal detector, as described previously.) This method is applicable not only to the womb but also to deep organs exposed during an operation. Further, if the measuring device is miniaturized to have a diameter of about several millimeters, it can be relatively easily inserted into a tubular or cavitary organ such as the womb, the gullet, the throat, the bronchus or the like. With an endoscope now widely used in clinical examinations, diagnosis is limited only to the surface of the area into which the endoscope is inserted. With the method described above, however, not only the surfaces of the target area and the neighboring region but also their interiors can be measured.

Next, a description will be given of a fifth embodiment of this invention. This concerns a method of focusing a homogeneous static field on the target area and a two-field generating method in relation to the first and third embodiments of the present invention described previously.

Figure 19A:
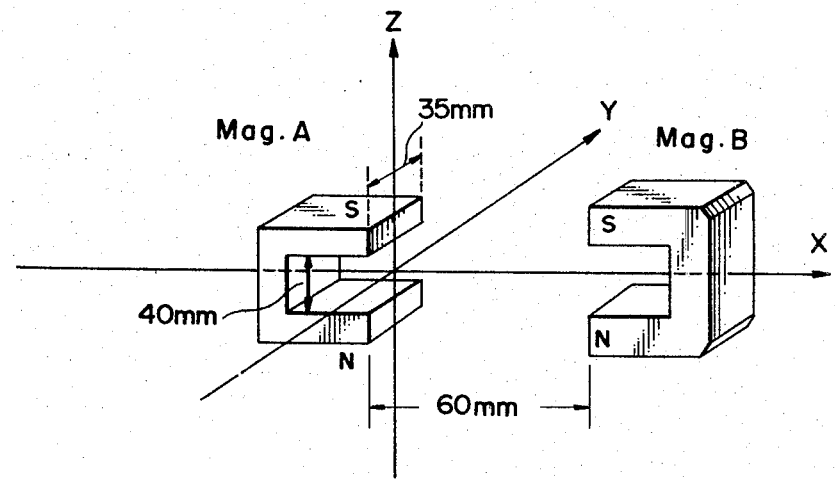
FIG. 19A shows the co-ordinate axis in the case of magnets being disposed opposite to each other.
Figure 19B:
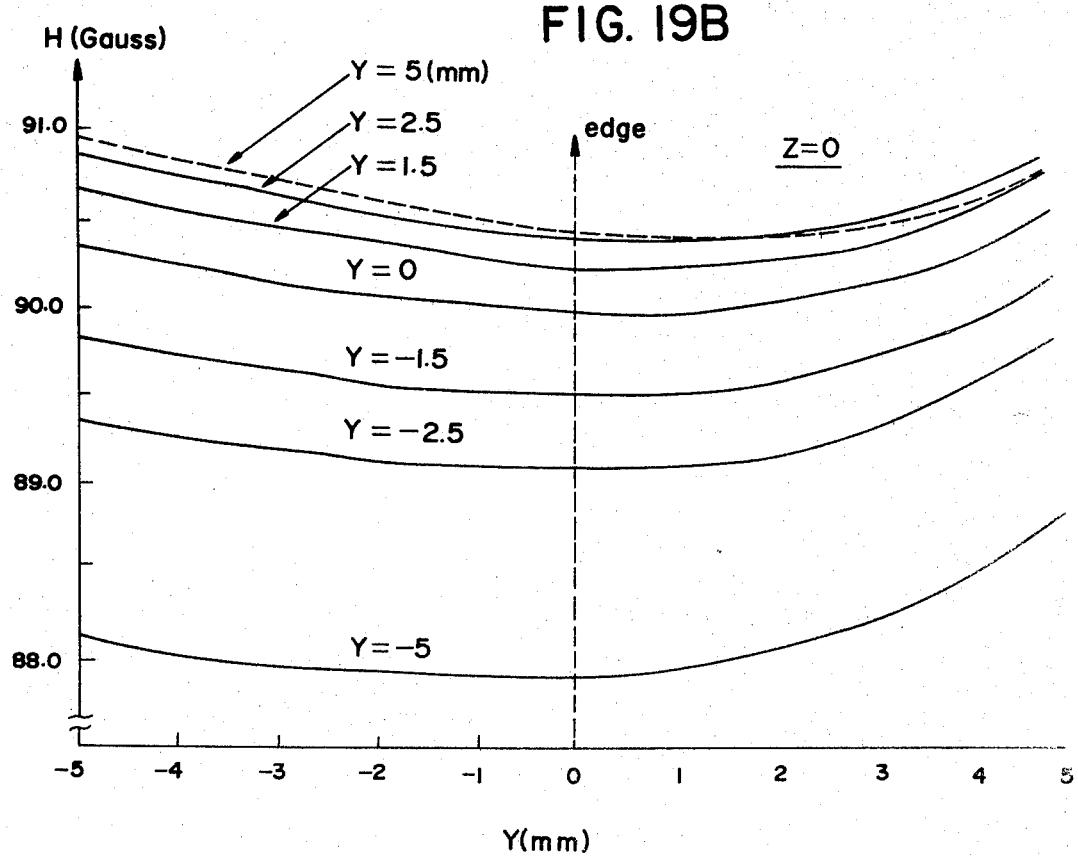
FIG. 19B shows the homogenious field distribution characteristics in the case of FIG. 19A.

A first method according to this embodiment is to dispose magnets or magnetic poles (or auxiliary pole pieces) in opposing relation to each other as shown in FIGS. 18A and 18B for focusing a homogeneous magnetic field on the target area. FIG. 18A shows the case where magnets 62 and 63 are disposed with their poles of the same polarity in opposing relation to each other across a body to be measured 60. FIG. 18B shows the case where magnetic poles 64 of opposite polarities mounted on a magnet are opposed to each other across the body 60. In FIGS. 18A and 18B, reference numeral 61 indicates the target area. By disposing the two magnets or magnetic poles with the poles of the same polarity facing to each other as illustrated, magnetic fields are cumulatively combined with each other to provide a composite magnetic field. The position of the homogeneous magnetic field thus formed cumulatively can be changed by an appropriate selection of the distance between the magnets or the magnetic poles and the homogeneity of the magnetic field can be improved effectively. Further, it is evident from the description of the first embodiment that enhancement of the field homogeneity and shifting of the homogeneous field region can be achieved by the employment of the afore mentioned wedge-shaped or like auxiliary pole pieces in combination with this method. By way of example, the results of measurement of the homogeneous field region in the air gap in the case of the arrangement of FIG. 18A is shown in FIG. 19A. This indicates that a homogeneous field distribution is provided in the vicinity of the plane including the end faces of the magnetic poles of a magnet A (corresponding to the magnet 62 in FIG. 18A). That is, it is understood that where a body to be measured is disposed between the both magnets, a homogeneous magnetic field can be focused on an area neighboring its skin surface. A magnet B in FIG. 19A corresponds to the magnet 63 in FIG. 18A.

A second method is to generate the aforementioned strong static magnetic field $H_{OS}$ and the homogeneous weak magnetic field $H_{OW}$ by the use of the arrangement depicted in FIG. 18A. At first, the strong static field $H_{OS}$ is applied by using both magnets or magnetic poles in a cumulative manner to the target area to be strongly magnetized. Then, the magnets or magnetic poles are disposed with their poles of opposite polarities facing toward each other (in the case of an electromagnet, the polarity of the current is inverted) so that magnetic fields are differentially combined with each other, by which the magnetic field of the target area is rendered into the homogeneous weak field $H_{OW}$ as compared with the surrounding magnetic field and a signal is detected. In the case of differentially combining the magnetic field to provide the composite field, the field intensity of the target area differs from that of the neighboring region. Accordingly, if the magnetic fields are differentially combined with each other so that the field intensity in the target area may be zero or substantially zero and if the earth magnetic field in which the body to be measured is placed or the field generated by the homogeneous static field generating means according to each of the above mentioned methods of this invention is employed as the homogeneous magnetic field for the signal detection, the signal only of the target area can be detected with high SN ratio, as is evident from the aforesaid third embodiment of this invention.

The foregoing has described the measuring methods of this invention with regard to its embodiments. The technical features of the methods of this invention may be summarized as follows: The intensity of the output signal to be detected is inversely proportional to approximately the square of the distance between the target area and the signal detector. Further, the signal intensity in the target area is proportional to about the square of the intensity of the static field applied thereto (about the 3/2 power in terms of S/N, if noises are neglected. However, the intensity of the field extending outwardly from the plane including magnetic pole faces of a horseshoe-shaped magnet of the central axis x between its magnetic poles (refer to FIG. 4) is in inverse proportion to substantially the square of the distance. Accordingly, where a static field is applied to the target area and the neighboring region, the signal intensity at a position spaced a certain distance apart form the target area lowers at the fourth power of the distance, as compared with the signal intensity in the target area. For example, in the case where the intensity of an output signal from the target area about 1 cm deep from the skin surface is used as the reference, the intensity of an output signal from an area 1 cm deeper than the target area is 1/32 that of the reference output, that is, lower by an order of magnitude than the intensity of the output signal from the target area. It is therefore seen that the signal detected by the detector contains substantially no pseudo-signals from the neighboring region. This implies that the SN ratio of the detected signal is improved relative to the signal from the neighboring region and that even if no special step is taken for compensating for the pseudo-signals, the signal detection can be achieved by an extremely simple method and with high resolution. Moreover, with the present invention, a variety of information on liquids, a tumor or the like, which cannot be obtained by other means, can be obtained in a very short time, as described previously. Therefore, the present invention is very useful in practice.

It will be apparent that many modifications and variations may be effected without departing from the scope of the novel concepts of this invention.

What is claimed is:

1. A method of obtaining information of a predetermined target area in a living body near its skin surface by the application of a nuclear magnetic resonance phenomenon, comprising the steps of:
   providing a static magnetic field generator in close proximity to said target area for generating a static magnetic field $H_O$;
   providing a radio-frequency magnetic field generator in close proximity to said target area for generating a radio-frequency magnetic field $H_1$ having a nuclear magnetic resonance frequency $f_0$;
   providing said radio-frequency magnetic field $H_1$ as a local inductive magnetic field;
   applying said magnetic fields $H_1$ and $H_0$ to said target area so that said fields perpendicularly intersect each other in said target area;
   focusing at least one of said magnetic fields onto a predetermined point coincident with said target area;
   disposing a means for signal isolating said target area from its surrounding area adjacent to said target area to permit said at least one focused field from causing nuclear magnetic resonance signals in said surrounding area;
   disposing a nuclear magnetic resonance signal detector approximately to said target area;
   detecting and measuring a nuclear magnetic resonance signal from said target area.

2. A method as in claim 1, wherein said step of focusing is achieved by providing a radio frequency magnetic field generator comprising a plurality of coils disposed with their center axes intersecting at a predetermined point, and by disposing said radio frequency magnetic field generator so that said predetermined point is coincident with said predetermined target area.

3. A method as in claim 1, wherein said step of focusing is achieved by providing a radio frequency magnetic field generator comprising a coil having a ferromagnetic core and by disposing said coil adjacent said target area so that the axis thereof intersects said target area.

4. A method as in claim 1, wherein said isolating means comprises a short circuiting coil disposed to surround said target area.

5. A method as in claim 1, wherein said isolating means comprises a ferromagnetic plate disposed so that said target area is between said plate and said field generators.

6. A method as in claim 1, wherein said step of providing a static magnetic field includes the steps of providing separately selectable intensities of static magnetic fields and further wherein a relatively strong static magnetic field is focused onto said target area prior to said detection and a relatively weak homogeneous static magnetic field is applied to said target area during said detection.

7. A method as in claim 6, wherein said steps of focusing said strong static magnetic field is performed by providing a magnet in said static magnetic field generator with suitably configured ferromagnetic auxiliary pole pieces mounted on poles of said magnet and disposing said magnet to apply said relatively strong static magnetic field to said target area, and said relatively weak static magnetic field is applied to the step of disposing said magnet to an unfocused position while focusing said radio-frequency magnetic field on said target area.

* * * * *

UNITED STATES PATENT AND TRADEMARK OFFICE
CERTIFICATE OF CORRECTION

PATENT NO. : 4,240,439  
DATED : December 23, 1980  
INVENTOR(S) : ZENUEMON ABE ET AL.

Page 1 of 2

Figure 11A:
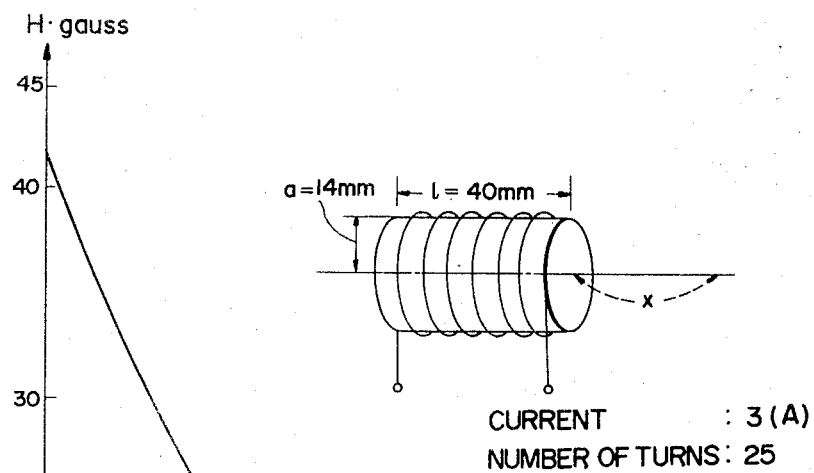
FIG. 11A shows a hollow coil.
Figure 11B:
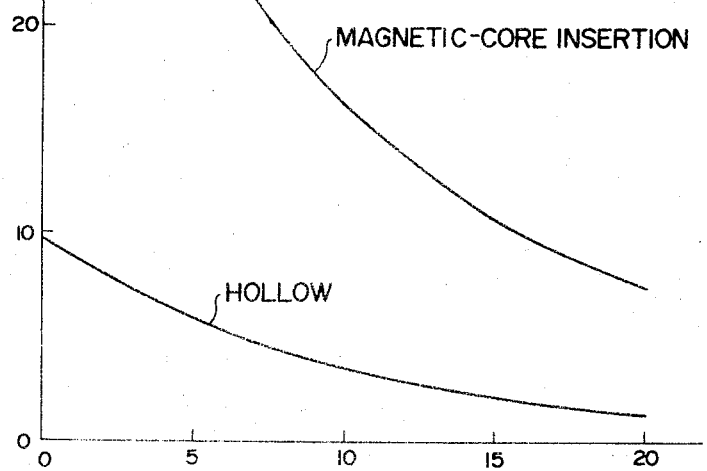
FIG. 11B shows the results of measurement of the magnetic field intensity obtained with the hollow coil and the coil having inserted therein a core.

It is certified that error appears in the above—identified patent and that said Letters Patent is hereby corrected as shown below:

Col. 3, line 59, "$F_o$" should be --$f_o$--;

Col. 4, line 59, "$\omega_o = \omega H_o$" should be --$\omega_o = \gamma H_o$--;

Col. 6, line 56, "(X=0," should be --(x=0,--;

Col. 7, line 4, "(X<0)" should be --(x<0)--;

Col. 8, lines 45 and 46, "FIG. 11" should be --FIGS. 11A and B--;

Col. 9, line 16, after "region" delete ",";

Col. 10, line 6, "$Hp^2$" should be --$H\rho^2$--;

line 14, "coils, the distance (1) the" should be --the coils, the distance ($\ell$)--;

line 55, "1" should be --$\ell$--;

Col. 11, line 65, "sufixes" should be --suffixes--;

Col. 12, line 16, "non-constant" should be --not constant--;

UNITED STATES PATENT AND TRADEMARK OFFICE
CERTIFICATE OF CORRECTION

PATENT NO. : 4,240,439

DATED : December 23, 1980

INVENTOR(S) : ZENUEMON ABE ET AL.

It is certified that error appears in the above—identified patent and that said Letters Patent is hereby corrected as shown below:

Col. 13, line 4, "FIG. 11" should be --FIG. 11B--;

line 5, after "magnetic" insert --field--, and after "body" insert --41--;

line 6, delete "41";

line 48, delete "whole";

Col. 14, line 67, "radiofrequency" should be --radio frequency--;

Col. 16, line 3, "the both" should be --both the--;

line 30, "above mentioned should be --aforementioned--;

line 34, "aforesaid" should be --aforementioned--;

Col. 17, line 37, after "area;" insert --and--;

Col. 18, line 35, after "applied" change "to" to --by--.

Signed and Sealed this

Twenty-sixth Day of May 1981

[SEAL]

Attest:

RENE D. TEGTMEYER

Attesting Officer — Acting Commissioner of Patents and Trademarks